（12）United States Patent
Nago

(10) Patent No.: US 6,346,336 B1
(45) Date of Patent: Feb. 12, 2002

(54) SOFT MAGNETIC FILM SOFT MAGNETIC MULTILAYER FILM METHOD OF MANUFACTURING THE SAME AND MAGNETIC DEVICE

(75) Inventor: Kumio Nago, Yamatokoriyama (JP)

(73) Assignee: Matsushita Electrical Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 09/316,839

(22) Filed: May 21, 1999

(30) Foreign Application Priority Data

May 27, 1998 (JP) .......................................... 10-146353

(51) Int. Cl.[7] .................................................. G11B 5/66
(52) U.S. Cl. ............. 428/692; 428/694 T; 428/694 TS; 428/694 TN; 428/900; 360/113; 204/192.2
(58) Field of Search ............................ 428/692, 694 T, 428/694 TS, 694 TM, 900; 360/113; 204/192.2

(56) References Cited

U.S. PATENT DOCUMENTS 5,736,264 A * 4/1998 Ishiwata et al. ......... 428/694 R
5,756,201 A * 5/1998 Kodono ....................... 428/332

FOREIGN PATENT DOCUMENTS

JP  2-251107  10/1990
JP  6-251939  9/1994

OTHER PUBLICATIONS

"Soft Magnetic Properties of Fe–N Films Composed of Two Phases" by S. Fujii et al., Journal of the Magnetics Society of Japan, vol. 17, No. 2, 1993, pp 333–338.
"Soft Magnetic Properties of Fe–N Films . . . " J. of Magnet. Society of Japan, vol. 17, No. 2, 1993, pp 333–338, 1993.*

* cited by examiner

Primary Examiner—Leszek Kiliman
(74) Attorney, Agent, or Firm—Sheridan Ross P.C.

(57) ABSTRACT

A soft magnetic film and a soft magnetic multilayer film of high saturation magnetization having an excellent soft magnetic property and a magnetic device use the same by providing an Fe—N thin film 2 formed on a substrate 1 with a configuration such that the main phases are α-Fe and γ'-Fe$_4$N, the crystal grain sizes of the α-Fe phase and the γ'-Fe$_4$N phase are reduced to as fine as not more than 10 nm, the spacings of the lattice plane (110) of α-Fe parallel to the film surface and the lattice plane (200) of γ'-Fe$_4$N are expanded compared to those in the condition where there is no lattice strain, and the spacing of the lattice plane (111) of γ'-Fe$_4$N is contracted compared to that in the condition where there is no lattice strain.

37 Claims, 18 Drawing Sheets

SOFT MAGNETIC FILM SOFT MAGNETIC MULTILAYER FILM METHOD OF MANUFACTURING THE SAME AND MAGNETIC DEVICE

BACKGROUND OF THE INVENTION

The present invention relates to a soft magnetic film and a soft magnetic multilayer film for a core material of antennas for liquid crystal televisions, pulse motors, choke coils, transformers, inductors, noise filters, electromagnetic interference suppressers, magnetic impedance devices and magnetic heads, etc., a method of manufacturing the same, and a magnetic device having the same.

In recent years, development of information communication apparatuses such as personal computers, electronic organizers and portable telephones has rapidly been proceeding. Further, it is predicted that advanced information communication apparatuses that handle various data such as texts, sounds, still images and moving images will form a large market as a technology to support the advanced information (multimedia) society.

With such background, size reduction, thickness reduction, weight reduction and higher performance are required of information communication apparatuses. In the parts constituting information communication apparatuses, semiconductor devices have been reduced in size since an early time by being formed into thin-film parts or by integration because of the development of the LSI technology. However, size reduction and thickness reduction of magnetic devices by being formed into thin-film parts and by integration have not been attained yet.

Recently, a high-performance magnetic material has been required because of the demand for size reduction, thickness reduction and higher performance of magnetic devices such as antennas for liquid crystal televisions, pulse motors, choke coils, inductors, transformers, magnetic heads, impedance devices that eliminate noise and electromagnetic interference suppressers. For the magnetic core materials used for these magnetic devices, it is required that high saturation magnetization, an excellent soft magnetic property and a thin configuration be easily obtained. Therefore, the demand is increasing for the development of a thin-film magnetic device that is greatly required to be formed into a thin film and uses as the core material a soft magnetic thin film having high saturation magnetization.

Conventionally, as magnetic core materials for the above-mentioned uses, crystalline alloys such as Sendust, Permalloy and silicon steel, and Co-based amorphous alloys have been used. However, to achieve size reduction, thickness reduction and higher performance of magnetic devices, a soft magnetic film having higher saturation magnetization with both a high saturation magnetic flux density and an excellent soft magnetic property is required.

However, the above-mentioned crystalline alloys such as Sendust and Permalloy and Co-based amorphous alloys have a saturation magnetic flux density of as low as approximately 1 T although having an excellent soft magnetic property. Moreover, the crystalline alloy of silicon steel is inferior in soft magnetic property although having a high saturation magnetic flux density.

Research and development of an Fe—N thin film as a material having a high saturation magnetic flux density of not less than 2 T are being made. For example, the Japanese Published Unexamined Patent Application, Pat. Publ. No. Sho 64-15907 and the Japanese Published Unexamined Patent Application, Pat. Publ. No. Hei 3-246913, disclose only Fe—N thin films having insufficient coercive forces Hc which exceed 10 e (79.5775 A/m) and their soft magnetic property is not suitable for the above-mentioned demands for thin-film magnetic devices.

BRIEF SUMMARY OF THE INVENTION

An object of the present invention is, in order to solve the above-mentioned problem, to provide higher-performance soft magnetic film and soft magnetic multilayer film with both a high saturation magnetic flux density and an excellent soft magnetic property, and a method of manufacturing the same.

Another object of the present invention is to realize size reduction, thickness reduction and higher performance of a magnetic device by employing a magnetic core material of an improved soft magnetic film or an improved soft magnetic multilayer film.

As a result of the inventor's further intensive researches on the Fe—N thin film, the below-mentioned fact was found. That is, a soft magnetic film of high saturation magnetization having an excellent soft magnetic property is obtained in an Fe—N thin film having a high saturation magnetic flux density, on the condition that the main phases are $\alpha$-Fe and $\gamma'$-Fe$_4$N, the crystal grain sizes of the $\alpha$-Fe phase and the $\gamma'$-Fe$_4$N phase are made fine, the spacings of the lattice plane (110) of $\alpha$-Fe parallel to the film surface and the lattice plane (200) of $\gamma'$-Fe$_4$N are expanded compared to those in the condition where there is no lattice strain, and the spacing of a lattice plane (111) of $\gamma'$-Fe$_4$N is contracted compared to that in the condition where there is no lattice strain. The existence of the above-mentioned phases can be confirmed by the X-ray diffraction analysis.

A soft magnetic film according to the present invention is a soft magnetic film containing Fe and N and in which the main phases are $\alpha$-Fe and $\gamma'$-Fe$_4$N, the mean grain diameters of the $\alpha$-Fe phase and the $\gamma'$-Fe$_4$N phase are not more than 10 nm, the spacings of the lattice plane (110) of $\alpha$-Fe parallel to the film surface and the lattice plane (200) of $\gamma'$-Fe$_4$N are expanded compared to those in the condition where there is no lattice strain and the spacing of the lattice plane (111) of $\gamma'$-Fe$_4$N is contracted compared to that in the condition where there is no lattice strain.

As is apparent from the above-mentioned results of researches, according to this structure, a higher-performance soft magnetic film having both a high saturation magnetic flux density and an excellent soft magnetic property can be realized.

A soft magnetic film according to another aspect of the present invention has a double-layer structure where a soft magnetic thin film is formed on a Si thin film. The soft magnetic thin film contains Fe and N, and in the soft magnetic thin film, the main phases are $\alpha$-Fe and $\gamma'$-Fe$_4$N, the mean grain diameters of the $\alpha$-Fe phase and the $\gamma'$-Fe$_4$N phase are not more than 10 nm, the spacings of the lattice strain (110) of $\alpha$-Fe parallel to the film surface and the lattice plane (200) of $\gamma'$-Fe$_4$N are expanded compared to those in the condition where there is no lattice strain, and the spacing of the lattice plane (111) of $\gamma'$-Fe$_4$N is contracted compared to that in the condition where there is no lattice strain.

The inventor confirmed through experiment that the soft magnetic film has a more excellent soft magnetic property by forming the soft magnetic thin film on the Si thin film.

A soft magnetic multilayer film according to the present invention comprises a soft magnetic film and a non-magnetic film being alternately laminated. The soft magnetic film contains Fe and N, and in the soft magnetic film, the main phases are α-Fe and γ'-Fe$_4$N, the mean grain diameters of the α-Fe phase and the γ'-Fe$_4$N phase are not more than 10 nm, the spacings of the lattice plane (110) of α-Fe parallel to the film surface and the lattice plane (200) of γ'-Fe$_4$N are expanded compared to those in the condition where there is no lattice strain, and the spacing of the lattice plane (111) of γ'-Fe$_4$N is contracted compared to that in the condition where there is no lattice strain.

In the soft magnetic multilayer film thus configured, the generation of eddy current due to magnetic induction between the laminated magnetic films can be suppressed even if the magnetic layers are increased in thickness, so that a magnetic core material being excellent in high-frequency characteristic can be provided.

A soft magnetic multilayer film according to another aspect of the present invention comprises a soft magnetic film and a non-magnetic film being alternately laminated. The soft magnetic film has a double-layer structure where a soft magnetic thin film is formed on a Si thin film. The soft magnetic thin film contains Fe and N, and in the soft magnetic thin film; the main phases of the film are α-Fe and γ'-Fe$_4$N; the mean grain diameters of the α-Fe phase and the γ'-Fe$_4$N phase are not more than 10 nm; the spacings of the lattice plane (110) of α-Fe parallel to the film surface and the lattice plane (200) of γ'-Fe$_4$N are expanded compared to those in the condition that there is no lattice strain; and the spacing of the lattice plane (111) of γ'-Fe$_4$N is contracted compared to that in the condition that there is no lattice strain.

In the soft magnetic multilayer film thus configured, the generation of eddy current due to magnetic induction between the laminated magnetic films can be suppressed even if the magnetic layers are increased in thickness, so that a magnetic core material being excellent in high-frequency characteristic can be provided.

Moreover, the present invention provides a method of manufacturing the soft magnetic film or the soft magnetic multilayer film. The method comprises the step of forming the soft magnetic film or the soft magnetic multilayer film on a cooled substrate.

By thus forming the soft magnetic film or the soft magnetic multilayer film on the cooled substrate, only an α-Fe microcrystal phase being lattice-expanded can be formed without any γ'-Fe$_4$N phase in the condition immediately after the film formation.

Moreover, the present invention provides a method of manufacturing the soft magnetic film or the soft magnetic multilayer film. The method comprises the step of annealing the soft magnetic film or the soft magnetic multilayer film formed on the cooled substrate at a temperature of not more than 300° C.

By thus annealing the soft magnetic film or the soft magnetic multilayer film formed on the cooled substrate at a temperature of not more than 300° C., a soft magnetic film can be formed that has a configuration such that the spacings of the lattice plane (110) of α-Fe parallel to the film surface and the lattice plane (200) of γ'-Fe$_4$N are expanded compared to those in the condition where there is no lattice strain and the spacing of the lattice plane (111) of γ'-Fe$_4$N is contracted compared to that in the condition where there is no lattice strain.

Moreover, it is desirable that a magnetic device including the soft magnetic film or the soft magnetic multilayer film in the magnetic core be one that is selected from among an antenna for a liquid crystal television, an electromagnetic interference suppresser, a noise filter, a pulse motor, a choke coil, a transformer, an inductor, a magnetic impedance device or a magnetic head. Due to excellent magnetic properties as described above, the soft magnetic film or the soft magnetic multilayer film can suitably be used for the achievement of size reduction, thickness reduction and higher performance of the selected magnetic device.

While the novel features of the invention are set forth particularity in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes, numbers or locations of the elements shown.

DETAILED DESCRIPTION OF THE INVENTION

Hereinafter, first to third preferred embodiments of the soft magnetic film according to the present invention will be described with reference to the attached FIGS. 1 to 9.

<<First Embodiment>>

Figure 1:
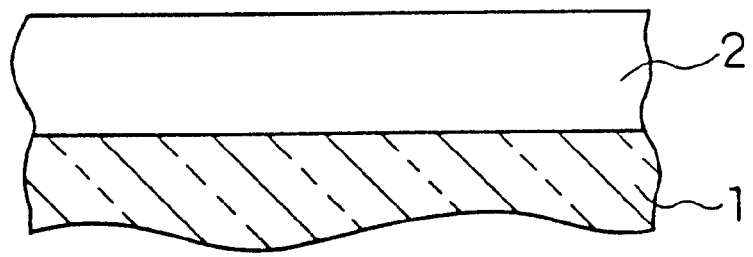
FIG. 1 is a cross-sectional view showing a soft magnetic thin film of a first embodiment of the present invention.

The inventor formed an Fe—N thin film 2 shown in FIG. 1 by a reactive sputtering method where $N_2$ gas is introduced into Ar gas with pure iron as the target in a reaction chamber of an RF(radio-frequency) diode sputtering apparatus. In FIG. 1, the Fe—N thin film 2 with a thickness of 1 $\mu$m is formed on a water-cooled Si substrate 1. The formed Fe—N thin film 2 was annealed for one hour at temperatures of 220 to 350° C. in a magnetostatic field of 48 kA/m in a vacuum of not more than $1\times10^{-3}$ pascals.

Figure 2:
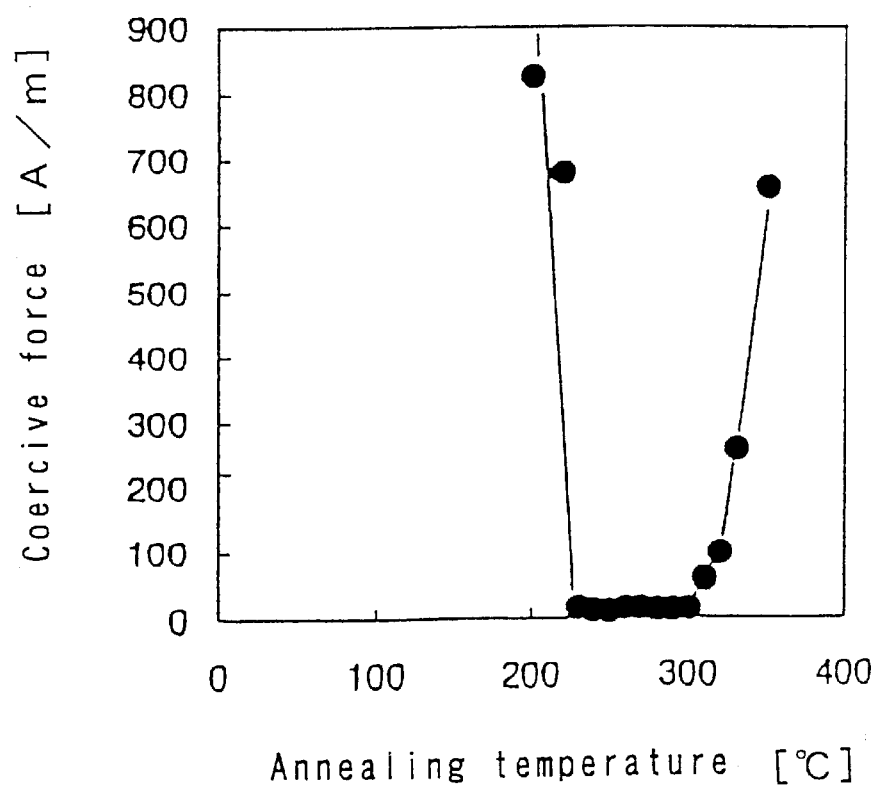
FIG. 2 is a view showing a relationship between the annealing temperature and the coercive force in an Fe—N thin film formed in the first embodiment of the present invention.

FIG. 2 is a graph showing changes in coercive force Hc with respect to the annealing temperature measured in the direction of the hard axis in the formed Fe—N thin film 2.

As shown in FIG. 2, although the coercive force is as high as not less than 650 A/m from immediately after the film formation to the annealing temperature of 220° C., the coercive force drastically decreases to as low as not more than 15 A/m in the annealing of 230° C. The low value of the coercive force is maintained until the annealing temperature becomes 300° C. At annealing temperatures of not less than 310° C., the value of the coercive force drastically increases. At 350° C., the coercive force is as high as approximately 650 A/m.

The saturation magnetic flux density of the Fe—N thin film 2 having such an excellent soft magnetic property was approximately 2 T at annealing temperatures of 230 to 300° C.

Figure 3:
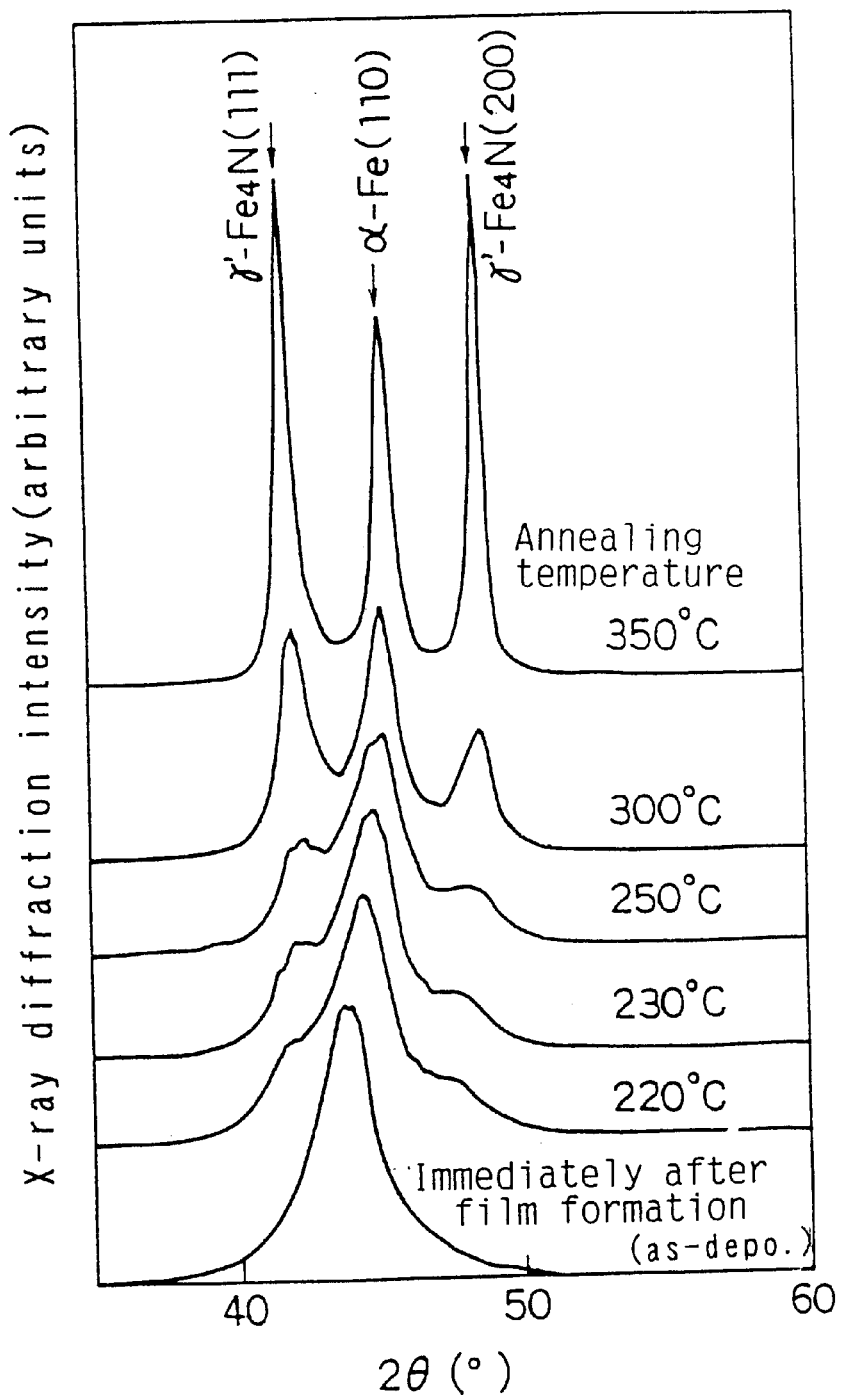
FIG. 3 is a view showing changes in X-ray diffraction pattern with respect to the annealing temperature in the Fe—N thin film formed in the first embodiment of the present invention.

FIG. 3 is a graph showing changes in X-ray diffraction pattern with respect to the annealing temperature in the formed Fe—N thin film 2.

As shown in FIG. 3, a comparatively broad diffraction peak without any $\gamma'$-$Fe_4N$ phase and with only a lattice-expanded (110) plane of $\alpha$-Fe is observed immediately after the film formation. In the annealing of 230° C. where the excellent soft magnetic property (the low coercive force of 15 A/m or less) appears, a broad diffraction peak with (111) and (200) lattice planes of $\gamma'$-$Fe_4N$ is observed.

Although the diffraction intensities of the lattice planes of $\alpha$-Fe and $\gamma'$-$Fe_4N$ increase as the annealing temperature increases, the diffraction peak is broad until the annealing of 300° C. until which the low coercive force is maintained. At this time, $\alpha$-Fe is oriented toward the (110) plane.

In the annealing of 350° C. where the soft magnetic property is damaged, the diffraction intensities of the lattice planes of $\alpha$-Fe and $\gamma'$-$Fe_4N$ drastically increase. It is apparent that the diffraction intensity of $\gamma'$-$Fe_4N$ is higher than that of $\alpha$-Fe.

Based on the results of the X-ray diffraction, the mean grain diameters of the (111) and the (200) planes of $\gamma'$-$Fe_4N$ and the (110) plane of $\alpha$-Fe were calculated by use of Debye-Sherrer equation.

Figure 4:
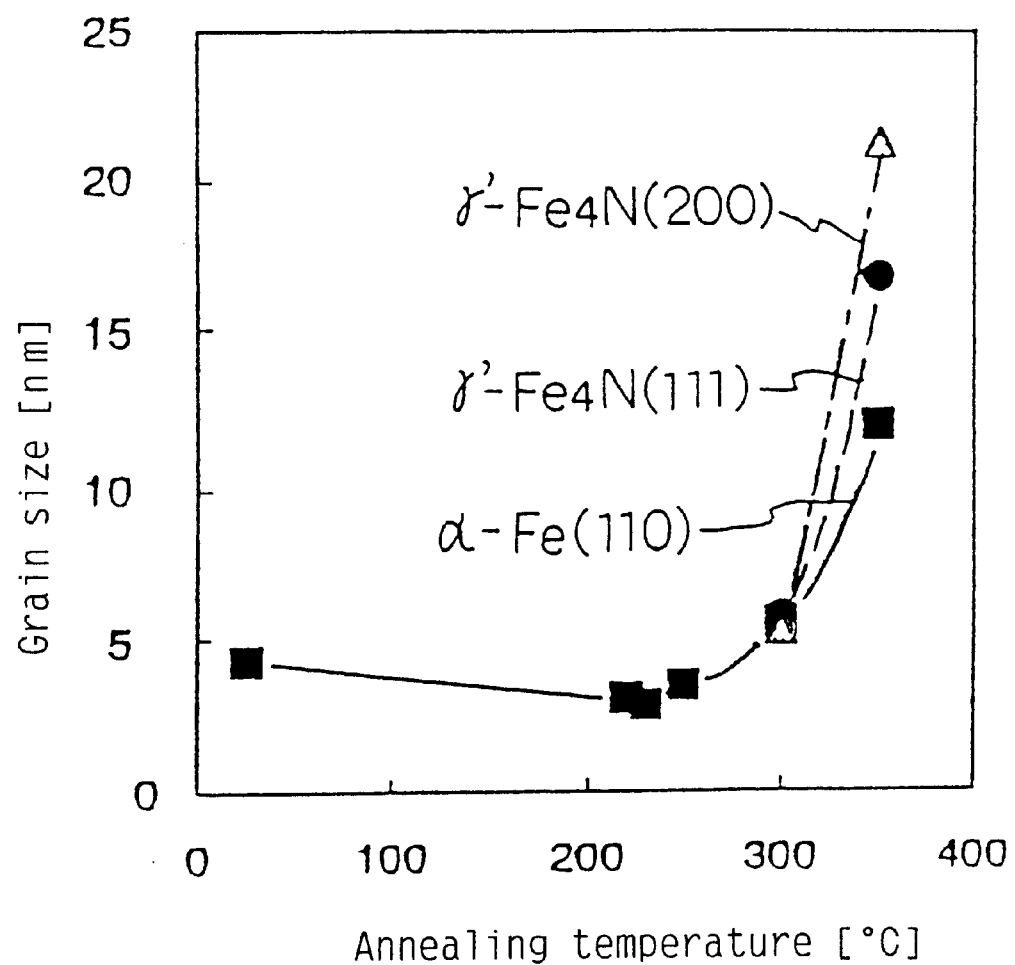
FIG. 4 is a view showing a relationship between the annealing temperature and the mean grain diameter in the Fe—N thin film formed in the first embodiment of the present invention.

FIG. 4 is a graph showing changes in mean grain diameter with respect to the annealing temperature. As shown in FIG. 4, at annealing temperatures of 230 to 300° C. where the $\alpha$-Fe phase and the $\gamma'$-$Fe_4N$ phase coexist and the excellent soft magnetic property is obtained, the mean grain diameter is not more than 10 nm in both the $\alpha$-Fe phase and the $\gamma'$-$Fe_4N$ phase. However, in the annealing of 350° C. where the soft magnetic property is damaged, it is apparent that the mean grain diameter is larger than 10 nm in both the $\alpha$-Fe phase and the $\gamma'$-$Fe_4N$ phase.

Subsequently, the lattice strain of the (111) and the (200) lattice planes of $\gamma'$-$Fe_4N$ parallel to the film surface and the (110) lattice plane of $\alpha$-Fe were evaluated by use of the equation shown below.

The lattice strain $\epsilon$ is expressed by the following equation (1) where $d_F$ is the lattice plane spacing of the thin film and d is the lattice plane spacing (in a condition where there is no lattice strain) of the bulk shown in the ASTM card:

$$\epsilon(\%)=(d_F-d)\times100/d \qquad (1)$$

Figure 5:
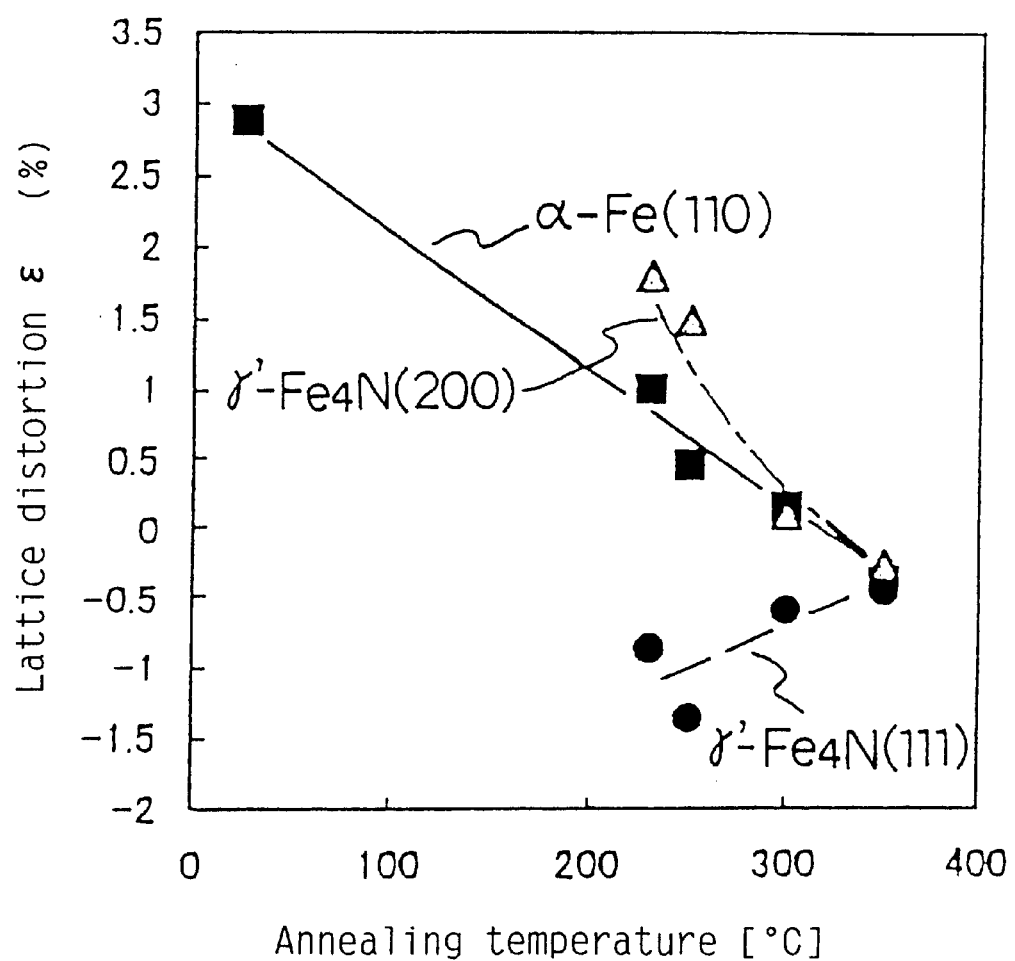
FIG. 5 is a view showing a relationship between the annealing and the lattice strain in the Fe—N thin film formed in the first embodiment of the present invention.

FIG. 5 is a graph showing changes in lattice strain with respect to the annealing temperature. In the values of the lattice strain $\epsilon$, the positive values represent an expanded condition, and the negative values represent a contracted condition. As shown in FIG. 5, at annealing temperatures of 230 to 300° C. where the excellent soft magnetic property is obtained, it is apparent that the spacings of the $\alpha$-Fe (110) and the $\gamma'$-$Fe_4N$ (200) lattice planes are expanded by not more than 2% compared to those in the condition where there is no lattice strain and the spacing of the $\gamma'$-$Fe_4N$ (111) lattice plane is contracted by not more than 1.5% compared to that in the condition where there is no lattice strain. In the annealing of 350° C. where the soft magnetic property is damaged, it is apparent that the spacings of the $\gamma'$-$Fe_4N$ (200), the $\gamma'$-$Fe_4N$ (111) and the $\alpha$-Fe (110) lattice planes are all contracted.

Figure 6:
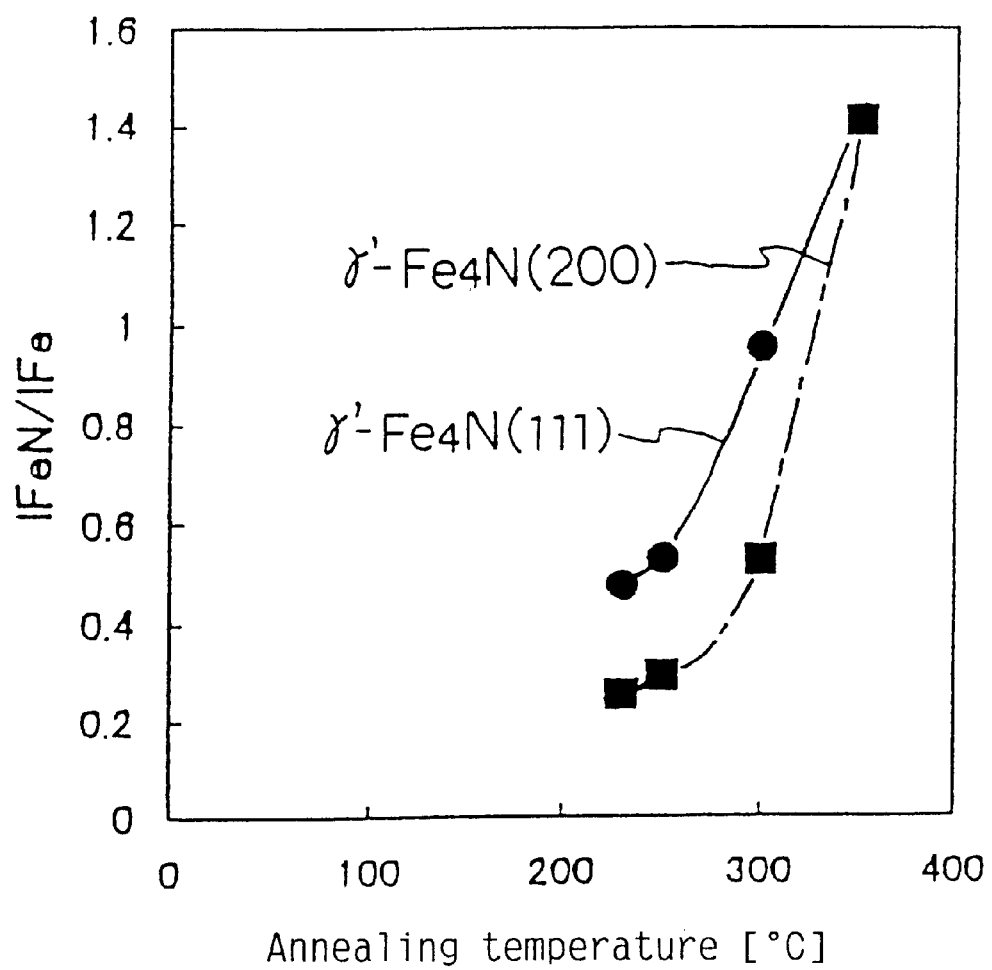
FIG. 6 is a view showing changes, with respect to the annealing temperature, in relative ratios of the X-ray diffraction intensities of the (200) and the (111) planes of γ'-Fe$_4$N to the X-ray diffraction intensity of the (110) plane of α-Fe in the Fe—N thin film formed in the first embodiment of the present invention.

FIG. 6 is a graph showing changes, with respect to the annealing temperature, of relative ratios IFeN/IFe of the X-ray diffraction intensity of the (111) and the (200) lattice planes of $\gamma'$-$Fe_4N$ to the X-ray diffraction intensity of the (110) lattice plane of $\alpha$-Fe. As mentioned above, at annealing temperatures of 230 to 300° C. where the excellent soft magnetic property (the low coercive force of not more than 15 A/m) is obtained, as shown in FIG. 6, it is apparent that the value of IFeN/IFe are not more than 1 in both the $\gamma'$-$Fe_4N$ (111) lattice plane and the $\gamma'$-$Fe_4N$ (200) lattice plane. In the annealing of 350° C. where the soft magnetic property is damaged, the value of IFeN/IFe is approximately 1.4.

Figure 7:
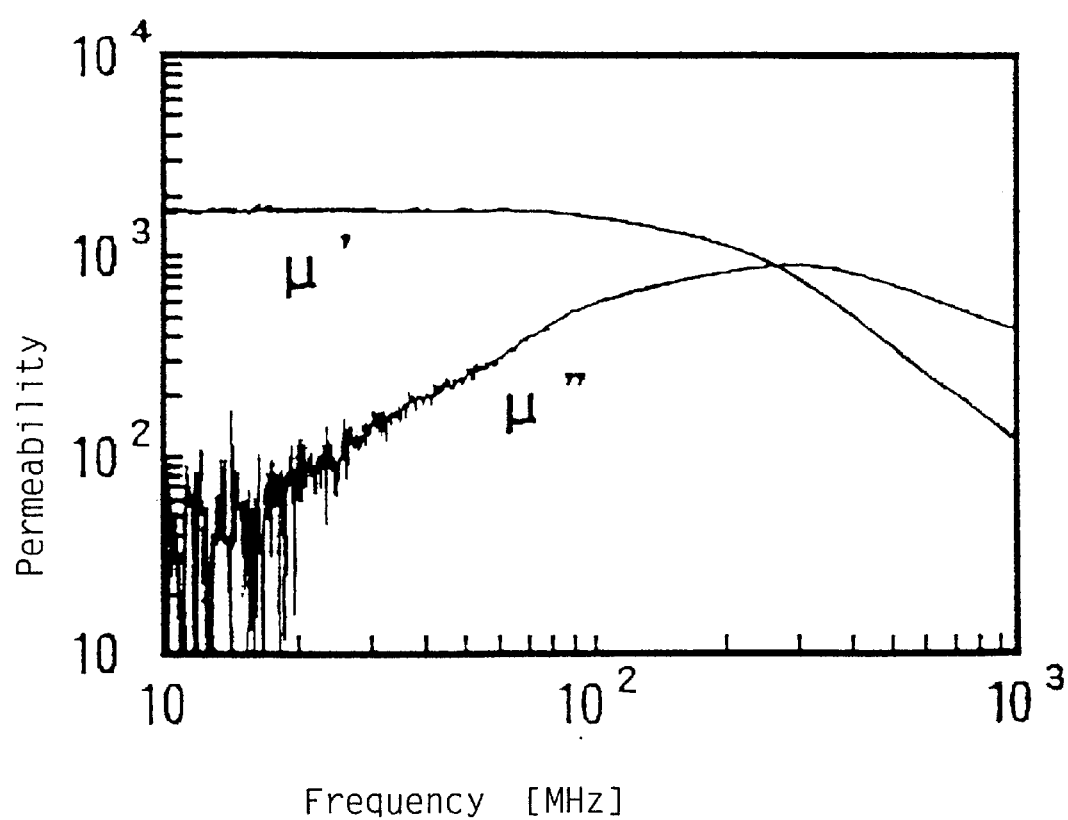
FIG. 7 is a view showing the frequency characteristic of permeability of a soft magnetic film formed in the first embodiment of the present invention.

Subsequently, the frequency characteristic of permeability of the soft magnetic film was measured. FIG. 7 is a graph showing the frequency characteristic of permeability of the Fe—N thin film 2 annealed at 250° C. for one hour. The permeability was measured in the direction of the hard axis of the soft magnetic film in the frequency band of 10 MHz to 1 GHz by a one-turn coil method. As shown in FIG. 7, the real part $\mu'$ of the permeability is 1700 at 50 MHz, not less than 1000 at 200 MHz, and as high as not less than 100 even at 1 GHz. In the imaginary part $\mu''$ of the permeability, the peak is situated in a frequency band of as high as 300 MHz.

The soft magnetic film was composed of 80 atom % of Fe and 20 atom % of N as a result of an analysis by a wavelength dispersion microanalyzer (XMA).

Moreover, in the soft magnetic film, as mentioned above, the α-Fe phase and the γ'-Fe$_4$N phase are the main phases, the mean grain diameters of the α-Fe phase and the γ'-Fe$_4$N phase are not more than 10 nm, the spacings of the (110) lattice plane of α-Fe parallel to the film surface and the (200) lattice plane of γ'-Fe$_4$N are expanded compared to those in the condition where there is no lattice strain, and the spacing of the (111) lattice plane of γ'-Fe$_4$N is contracted compared to that in the condition where there is no lattice strain.

<<Second Embodiment>>

Figure 8:
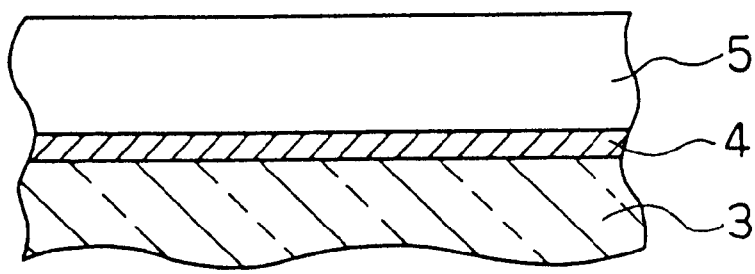
FIG. 8 is a cross-sectional view showing a soft magnetic thin film of a second embodiment of the present invention.

Next, a second embodiment of the soft magnetic thin film according to the present invention will be described with reference to the attached FIG. 8. FIG. 8 is a cross-sectional view of the soft magnetic thin film of the second embodiment. As shown in FIG. 8, a Si thin film 4 of 50 nm was formed on a Ti—Mg—Ni—O ceramic substrate 3, and an Fe—N thin film 5 with a thickness of 1 μm was formed on the Si thin film 4 by the reactive sputtering method like in the above-described first embodiment. The formed Fe—N thin film 5 was annealed at 250° C. for one hour in a magnetostatic field of 48 kA/m in a vacuum of not more than 1×10$^{-3}$ pascals. The coercive forces in the direction of the hard axis of the soft magnetic thin film with the double-layer structure, wherein the Fe—N thin film 5 is formed on the Si thin film 4, are shown in Table 1 together with those of the 1-μm-thick single-layer Fe—N thin film of the above-described first embodiment. In Table 1, comparison is made between cases where Si is used as the substrate and where ceramic is used as the substrate.

TABLE 1

| Substrate | Single-layer film | Double-layer film |
| --- | --- | --- |
| Si | 5 A/m | 5 A/m |
| Ceramic | 42 A/m | 5 A/m |

As shown in Table 1, the coercive force of the single-layer Fe—N thin film formed on the Si substrate is as low as 5 A/m, which is equal to the coercive force of the soft magnetic thin film having the double-layer structure, wherein the Si thin film is formed on the Si substrate and the Fe—N thin film is formed thereon.

However, although the coercive force of the single-layer Fe—N soft magnetic thin film formed on the ceramic substrate is 42 A/m, by using the soft magnetic thin film having the double-layer structure, wherein the Si thin film is formed on the ceramic substrate and the Fe—N thin film is formed on the Si thin film, a coercive force is obtained that is as low as 5 A/m being equal to the coercive force of the single-layer Fe—N thin film formed on the Si substrate.

The realization of the excellent soft magnetic property obtained in the soft magnetic thin film having the double-layer structure, wherein the Si thin film is formed on the substrate and the Fe—N thin film is formed thereon is not limited to the case where the ceramic substrate is used. Similar effects are obtained in a case where glass or an organic film is used as the substrate material.

The thickness of the Si thin film according to the present invention is not limited to 50 nm. Similar advantages are obtained when the Si thin film has any arbitrary thickness.

<<Third Embodiment>>

Figure 9:
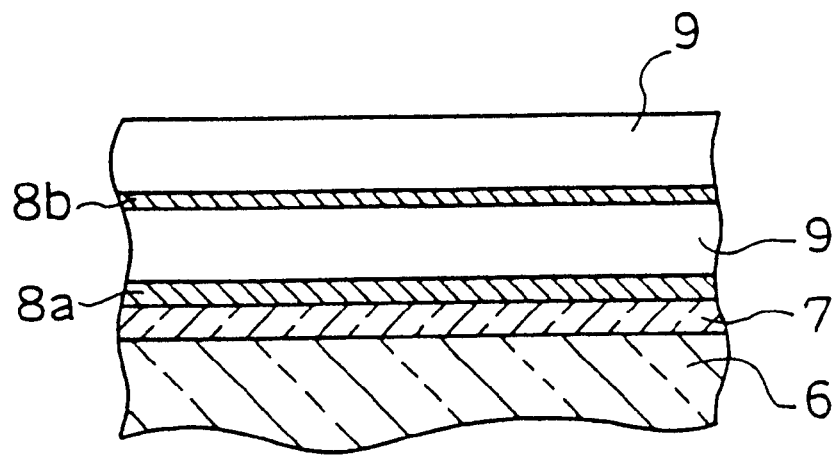
FIG. 9 is a cross-sectional view showing a soft magnetic thin film of a third embodiment of the present invention.

Next, a third embodiment of the soft magnetic thin film according to the present invention will be described with reference to the attached FIG. 9. FIG. 9 is a cross-sectional view of a soft magnetic thin film of the third embodiment. As shown in FIG. 9, an Al$_2$O$_3$ thin film 7 was formed on an Al$_2$O$_3$—TiC substrate 6, and a Si thin film 8a with a thickness of 50 nm was formed thereon. An Fe—N thin film 9 with a thickness of 0.5 μm was formed on the Si thin film 8a, a Si thin film 8b with a thickness of 5 nm was formed thereon, and an Fe—N thin film 9 with a thickness of 0.5 μm was formed thereon. The multilayer soft magnetic thin film thus formed was annealed at 260° C. for one hour in a magnetostatic field of 48 kA/m in a vacuum of not more than 1×10$^{-3}$ pascals.

The coercive force of the soft magnetic film in the direction of the hard axis was 15 A/m. Comparing this value with 49 A/m which is the value of the coercive force of a case where an Al$_2$O$_3$ thin film is formed on an Al$_2$O$_3$—TiC substrate and a 1-μm-thick single-layer Fe—N thin film is formed thereon, it is apparent that the soft magnetic property of the soft magnetic thin film of the multilayer structure is significantly improved.

The soft magnetic thin film may include several atom % of at least one element selected from among Ti, Ta, Hf, Zr, V, Mo, W, Cr, Al, Si, Ru and Rh or may include a very small quantity of an element other than these as long as the objects of the present invention are achieved.

<<Fourth Embodiment>>

Next, a fourth embodiment of the soft magnetic multilayer film according to the present invention will be described with reference to the attached FIGS. 10 to 13.

Figure 10:
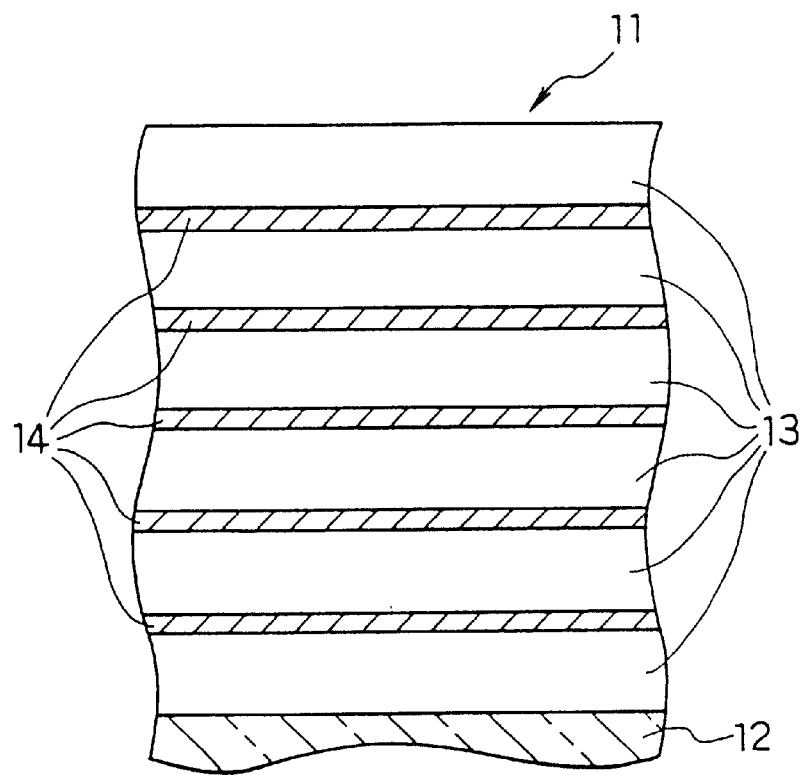
FIG. 10 is a cross-sectional view showing a soft magnetic multilayer film of a fourth embodiment of the present invention.

FIG. 10 is a cross-sectional view showing an example of a soft magnetic multilayer film according to the fourth embodiment of the present invention. The basic structure of the soft magnetic multilayer film 11 is such that soft magnetic films 13 and non-magnetic films 14 are alternately laminated on the surface of a substrate 12. The magnetic films 13 comprise at least one kind of the soft magnetic thin film of the first embodiment shown in FIG. 1 where the single-layer Fe—N thin film is formed, the soft magnetic thin film of the second embodiment shown in FIG. 8 having the double-layer structure where the Fe—N thin film is formed on the Si thin film, and the soft magnetic thin film of the third embodiment having the multilayer structure where the soft magnetic thin films having the double-layer structure are formed in a plurality of layers. The number of layers and the thicknesses of the layers are not limited but are set in accordance with required characteristics.

The soft magnetic multilayer film may be formed of soft magnetic films 13 and/or non-magnetic films 14 having different thicknesses which films 13 comprise at least one kind of the soft magnetic film comprising the single-layer Fe—N thin film, the soft magnetic thin film having the double-layer structure where the Fe—N thin film is formed on the Si thin film, or the soft magnetic thin film where the soft magnetic thin films having the double-layer structure are formed in a plurality of layers.

Figure 11:
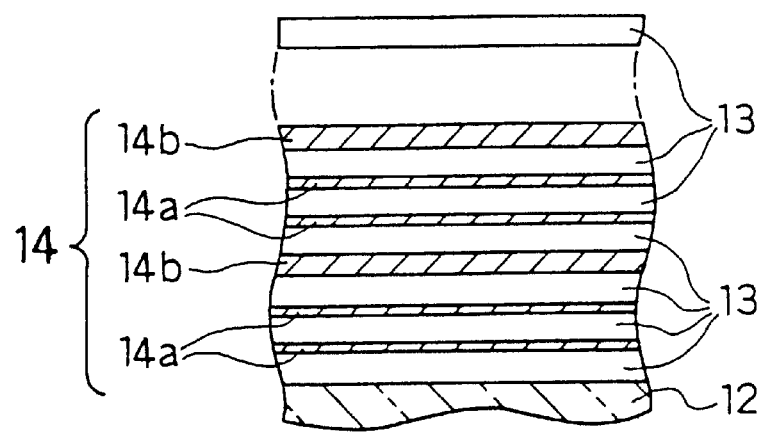
FIG. 11 is a cross-sectional view showing another example of the soft magnetic multilayer film.
Figure 12:
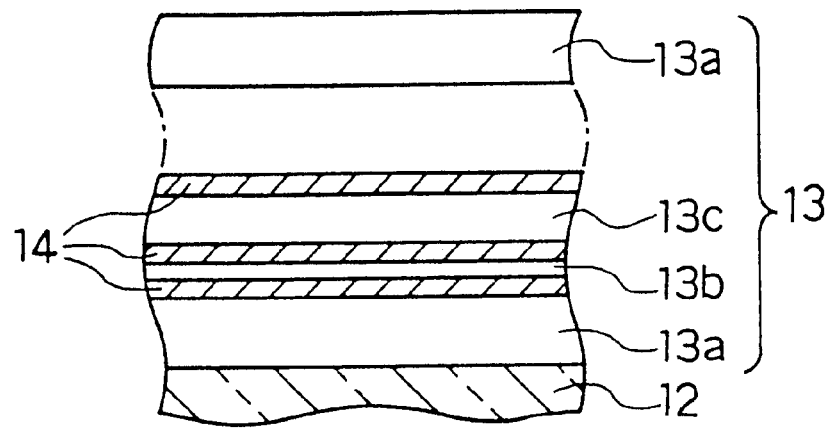
FIG. 12 is a cross-sectional view showing another example of the soft magnetic multilayer film.
Figure 13:
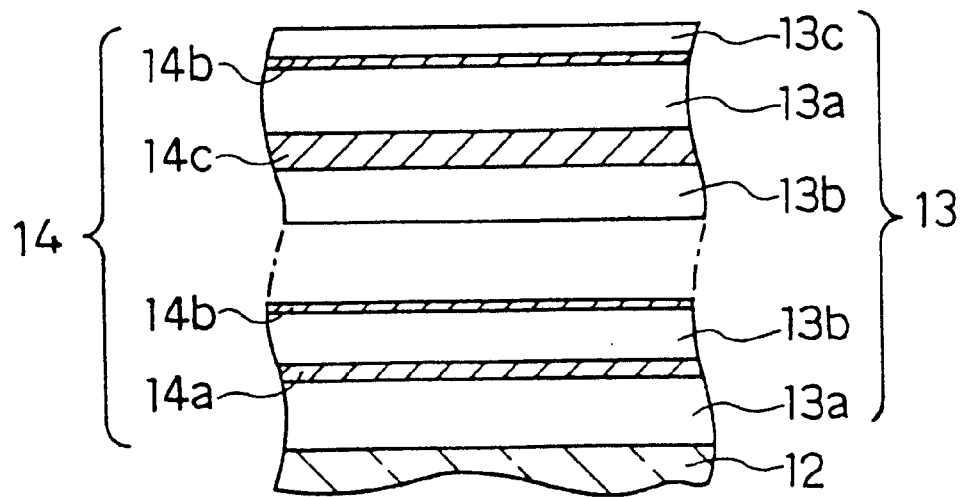
FIG. 13 is a cross-sectional view showing another example of the soft magnetic multilayer film.

FIG. 11 shows an example in which the non-magnetic films 14 comprise two kinds of films having different thicknesses, that is, a non-magnetic film 14a with a thickness of 0.5 to 50 nm and a non-magnetic film 14b with a thickness of 50 to 500 nm. FIG. 12 shows an example in which the soft magnetic films 13 comprise three soft magnetic films 13a, 13b and 13c having different thicknesses. FIG. 13 shows an example in which the soft magnetic films 13 and the non-magnetic films 14 each comprise films having different thicknesses. In FIGS. 11 to 13, reference designations a, b and c indicate that the films denoted by the same reference marks have the same thickness. In these examples, the desirable thicknesses of the soft magnetic films 13 are 5 to 5000 nm.

The soft magnetic thin film 13 can be formed by the reactive sputtering method where $N_2$ gas is introduced into Ar gas with pure iron as the target by use of an RF diode sputtering apparatus. Nitrogen contained in the soft magnetic thin film 13 can be made appropriate by adjusting the partial pressure of the $N_2$ gas in the atmosphere.

Here, as the non-magnetic film 14, $SiO_2$, $Al_2O_3$, AlN, BN, TiN, SiC, Cu, C or Ti, or a nitride, an oxide or a dioxide of Ta, Nb, Zr or Hf can be used. It is desirable to form and laminate the non-magnetic film 14 and the Si thin film continuously with the soft magnetic th in film 13 by the RF sputtering method or the like similarly to the soft magnetic thin film 13.

<<Fifth Embodiment>>

Next, a fifth embodiment which is a magnetic device of the present invention using the soft magnetic thin film or the soft magnetic multilayer film described in the above-described embodiments will be described with reference to FIGS. 14 to 24.

Figure 14:
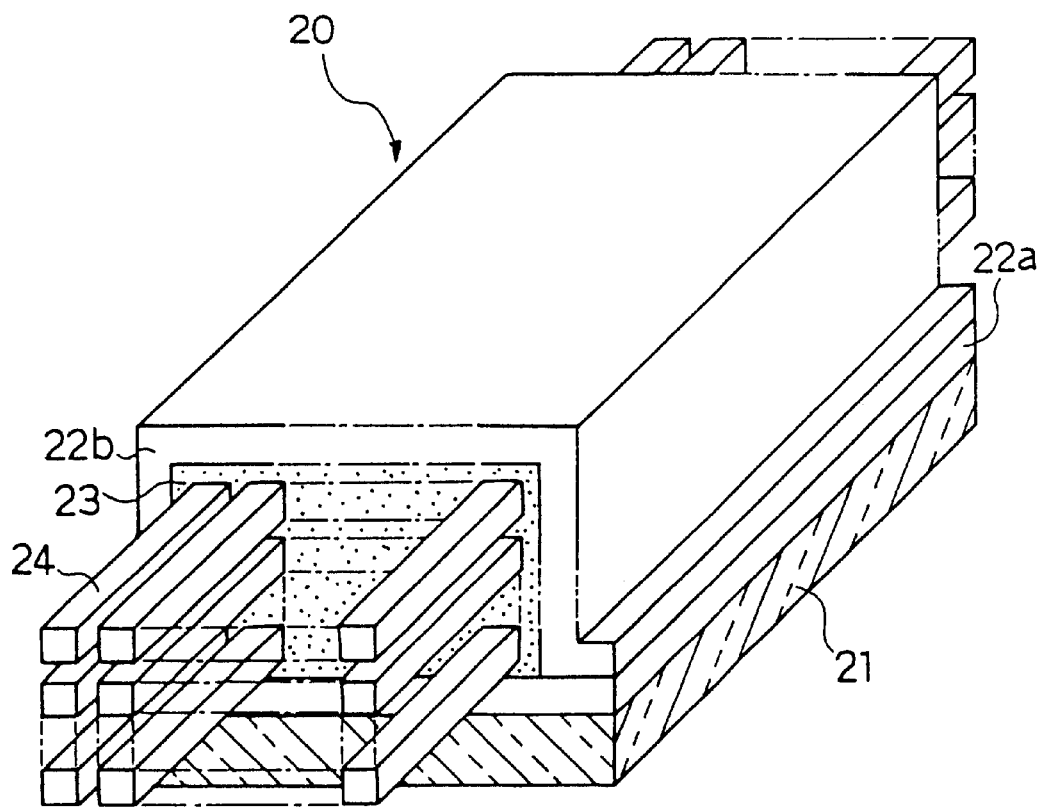
FIG. 14 is a perspective view showing an example of a noise filter according to a fifth embodiment of the present invention.

FIG. 14 is a perspective view showing a noise filter which is an example of the magnetic device of the fifth embodiment according to the present invention. In the noise filter 20, o n a lower soft magnetic film 22a formed on the surface of a non-magnetic substrate 21, a plurality of bar conductors 24 made of a conductor such as Cu or Al form a complex by being arranged in rows and columns so as to be uniformly spaced from each other in their cross-section in an insulator 23 such as $SiO_2$. The complex is surrounded by an upper soft magnetic film 22b being in contact with the top surface and the side surfaces of the insulator 23, and the lower soft magnetic film 22a.

The lower soft magnetic film 22a and the upper soft magnetic film 22b may be any of single-layer soft magnetic thin films, soft magnetic thin films having the double-layer structure where the Fe—N thin film is formed on the Si thin film, or soft magnetic thin films where the soft magnetic thin films having the double-layer structure are formed in a plurality of layers. Moreover, the layers 22a and 22b may be soft magnetic multilayer films where the above-mentioned soft magnetic thin films and non-magnetic films are alternately laminated.

Figure 15:
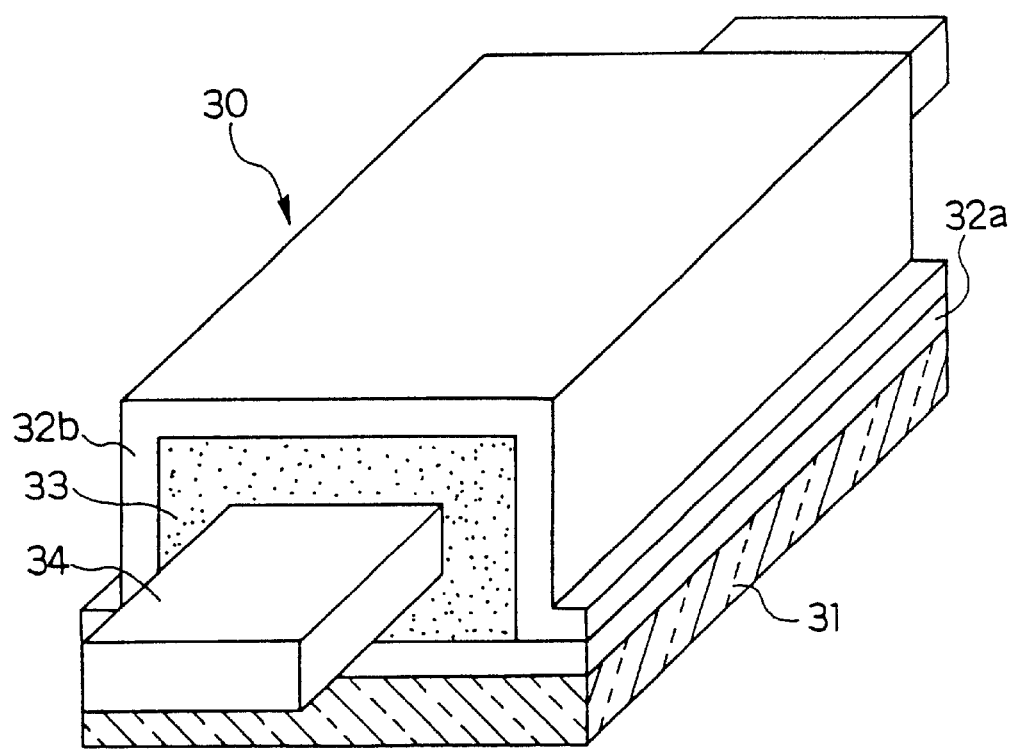
FIG. 15 is a perspective view showing another example of the noise filter which is a magnetic device according to the present invention.

FIG. 15 shows another example of the noise filter. As shown in FIG. 15, a noise filter 30 including one conductor 34 has a configuration such that the conductor 34 and an insulator 33 are surrounded by a lower soft magnetic film 32a formed on the surface of a non-magnetic substrate 31 and an upper soft magnetic film 32b being in contact with the top surface and the side surfaces of the insulator 33.

The lower soft magnetic film 32a and the upper soft magnetic film 32b may be any of single-layer soft magnetic thin films, soft magnetic thin films having the double-layer structure, wherein the soft magnetic thin film is formed on the Si thin film, or soft magnetic thin films, wherein the soft magnetic films having the double-layer structure are further formed in a plurality of layers. Moreover, the films 32a and 32b may be soft magnetic multilayer films, wherein soft magnetic thin films configured as described above and non-magnetic films are alternately laminated.

It is desirable that the composition range of the Fe—N thin film constituting the soft magnetic thin films be such that N is 1 to 25 atom % and Fe is 75 to 99 atom %.

As mentioned above, the noise filter which is an example of the magnetic device according to the present invention has the bar conductor 34, the insulator 33 covering the conductor 34, the lower soft magnetic film 32a and the upper soft magnetic film 32b. The lower soft magnetic film 32a and the upper soft magnetic film 32b are disposed to surround the surface of the insulator, and to sandwich the insulator 33. In the lower soft magnetic film 32a and the upper soft magnetic film 32b, it is desirable that (i) the main phases are α-Fe and γ'-$Fe_4N$, (ii) the mean grain diameters of the α-Fe phase and the γ'-$Fe_4N$ phase are not more than 10 nm, (iii) the spacings of the (110) lattice plane of α-Fe parallel to the film surface and the (200) lattice plane of γ'-$Fe_4N$ are expanded compared to those in the condition where there is no lattice strain, and (iv) the spacings of the (111) lattice plane of γ'-$Fe_4N$ are contracted compared to that in the condition where there is no lattice strain.

Figure 16:
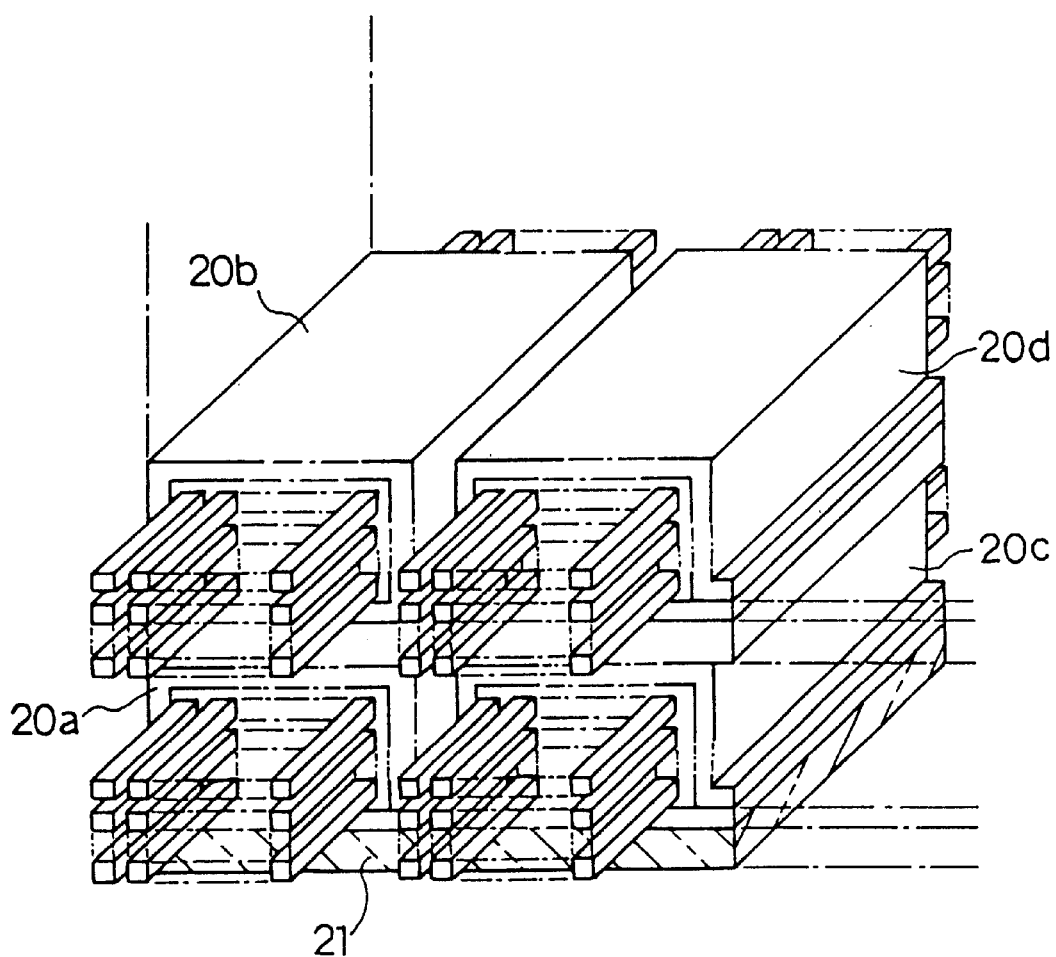
FIG. 16 is a perspective view showing another example of the noise filter shown in FIG. 14.

The noise filter of the fifth embodiment is usable in an example wherein a plurality of noise filters 20a to 20d are arranged in rows and columns on the non-magnetic substrate 21 as shown in FIG. 16.

An electromagnetic interference suppresser which is an example of the magnetic device of the fifth embodiment has a configuration such that one of the following films is formed on a substrate like an organic film such as polyimide, (i) a single-layer soft magnetic thin film, (ii) a soft magnetic thin film having the double-layer structure, wherein the Fe—N thin film is formed on the Si thin film, (iii) a soft magnetic thin film wherein the soft magnetic thin films having such a double-layer structure are further formed in a plurality of layers, or (iv) a soft magnetic multilayer film where the soft magnetic thin films configured as described above and the non-magnetic films are alternately laminated.

In the electromagnetic interference suppresser of the fifth embodiment, it is desirable that the main phases be α-Fe and γ'-$Fe_4N$, that the mean grain diameters of the α-Fe phase and the γ'-$Fe_4N$ phase are not more than 10 nm, that the spacings of the (110) lattice plane of α-Fe parallel to the film surface and the (200) lattice plane of γ'-$Fe_4N$ are expanded compared to those in the condition where there is no lattice strain, and that the spacing of the (111) lattice plane of γ'-$Fe_4N$ be contracted compared to that in the condition where there is no lattice strain.

Figure 17:
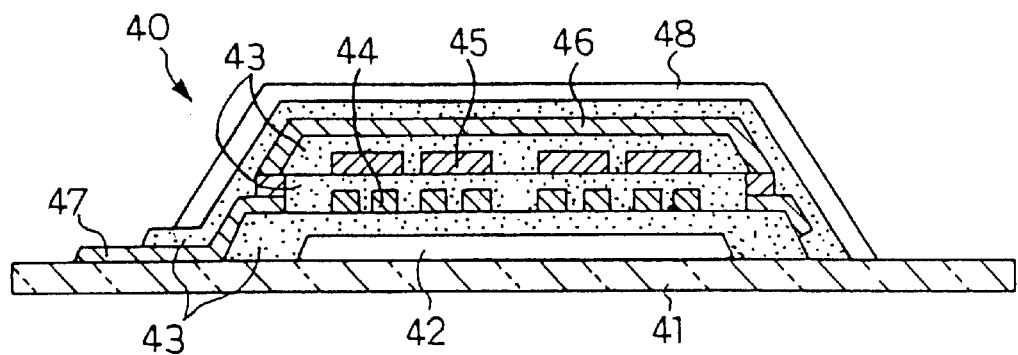
FIG. 17 is a perspective view showing an example of a thin-film transformer which is a magnetic device according to the present invention.

FIG. 17 shows a thin-film transformer which is an example of the magnetic device according to the present invention. The thin-film transformer 40 has a laminated structure in which the following are formed on a part of the surface of a non-magnetic substrate 41 such as glass or Si wafer, in sequence from below in the figure, a lower soft magnetic film 42, an insulator film 43, a secondary coil 44, the insulator film 43, a primary coil 45, the insulator film 43, the conductor 46, the insulator film 43, and an upper soft magnetic film 48. The laminated structure is substantially covered with the upper soft magnetic film 48. A terminal 47 is lead out from between the upper soft magnetic film 48 and the non-magnetic substrate 41.

The secondary coil 44, the primary coil 45 and the conductor 46 are made of a conductive material, preferably Cu. The insulator film 43 is made of $SiO_2$ preferably. Moreover, as shown in FIG. 17 in a simplified form, the primary coil 45 and the secondary coil 44 are wound in a horizontal direction (in a direction parallel to the laminated surface). The winding ratio is set to a predetermined ratio.

Therefore, the thin-film transformer 40 which is an example of the magnetic device according to the present invention has the primary coil 45 and the secondary coil 44 that are wound within a plane parallel to the laminated surface laminated with the insulator film 43 in between, and the lower soft magnetic film 42 and the upper soft magnetic film 48 that are disposed so as to sandwich the primary coil 45 and the secondary coil 44 with the insulator film 43 in between. In the lower soft magnetic film 42 and the upper soft magnetic film 48, it is desirable that the main phases be $\alpha$-Fe and $\gamma'$-Fe$_4$N, that the mean grain diameters of the $\alpha$-Fe phase and the $\gamma'$-Fe$_4$N phase be not more than 10 nm, the spacings of the (110) lattice plane of $\alpha$-Fe parallel to the film surface and the (200) lattice plane of $\gamma'$-Fe$_4$N be expanded compared to those in the condition where there is no lattice strain, and the spacing of the (111) lattice plane of $\gamma'$-Fe$_4$N be contracted compared to that in the condition where there is no lattice strain.

The lower soft magnetic film 42 and the upper soft magnetic film 48 shown in FIG. 17 constitute the magnetic core of the thin-film transformer, and like in the above-described embodiments, may be any of single-layer soft magnetic thin films, soft magnetic thin films having the double-layer structure where the Fe—N thin film is formed on the Si thin film and soft magnetic thin film where the soft magnetic films having the double-layer structure are further formed in a plurality of layers. Moreover, the lower soft magnetic film 42 and the upper soft magnetic film 48 may be soft magnetic multilayer films where soft magnetic thin films configured as described above and non-magnetic films are alternately laminated. It is desirable that the composition range of the Fe—N thin film constituting the soft magnetic films be such that N is 1 to 25 atom % and Fe is 75 to 99 atom %.

Figure 18:
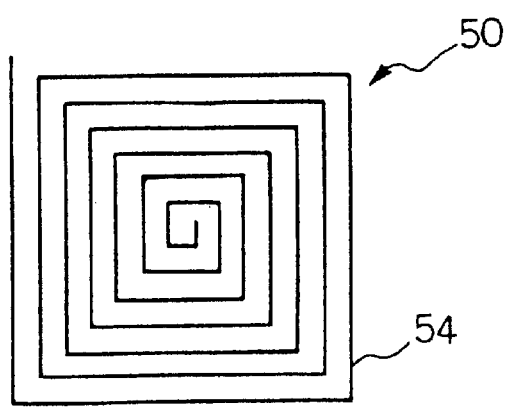
FIG. 18 is a plan view showing an example of a thin-film inductor which is a magnetic device according to the present invention.
Figure 19:
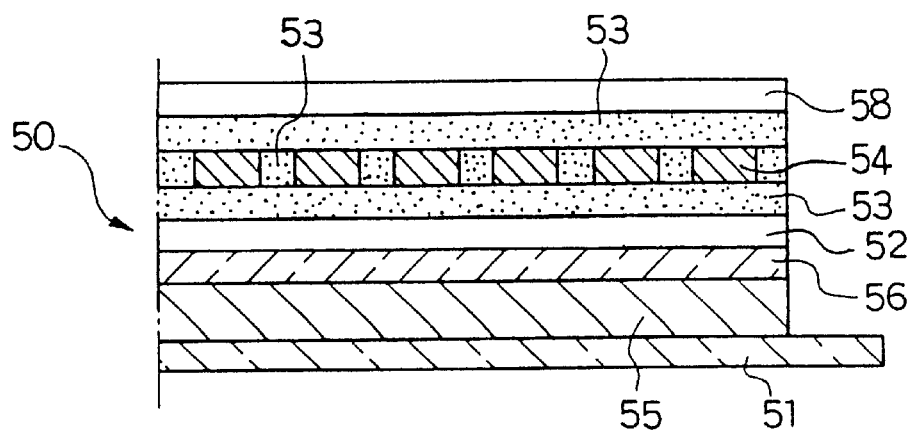
FIG. 19 is a partial cross-sectional view of the thin-film inductor having a conductor film shown in FIG. 18.

FIGS. 18 and 19 show an example of a thin-film inductor. The thin-film inductor is a thin-film inductor on a Si chip in a Si-chip-mounting microreactor. FIG. 18 is a plan view showing a conductor film 54 constituting a layer of the thin-film inductor. FIG. 19 is a cross-sectional view of a thin-film inductor 50 having the conductor film 54 of FIG. 18. In FIG. 19, the thin-film inductor 50 has a laminated structure in which the following are formed on a Si chip 55 on an IC package 51, in sequence from below in the figure, a SiO$_2$ film 56, a lower soft magnetic film 52, an insulator film 53 such as SiO$_2$, the conductor film 54 such as Cu or Al having a pattern wound in the direction of the laminated surface, and an upper soft magnetic film 58.

As mentioned above the thin-film inductor 50 which is an example of the magnetic device according to the present invention has the laminated structure provided with the conductor film 54 comprising a thin-film coil wound on a plane parallel to the direction of the laminated surface, and the lower soft magnetic film 52 and the upper soft magnetic film 58 disposed so as to sandwich the conductor film 54. In the lower soft magnetic film 52 and the upper soft magnetic film 58, it is desirable that the main phases be $\alpha$-Fe and $\gamma'$-Fe$_4$N, that the mean grain diameters of the $\alpha$-Fe phase and the $\gamma'$-Fe$_4$N phase be not more than 10 nm, that the spacings of the (110) lattice plane of $\alpha$-Fe parallel to the film surface and the (200) lattice plane of $\gamma'$-Fe$_4$N be expanded compared to those in the condition where there is no lattice strain, and that the spacing of the (111) lattice plane of $\gamma'$-Fe$_4$N be contracted compared to that in the condition where there is no lattice strain.

The soft magnetic films 52 and 58 constitute the magnetic core of the thin-film inductor 50, and like in the above-described embodiments, may be any of single-layer soft magnetic thin films, soft magnetic thin films having the double-layer structure where the Fe—N thin film is formed on the Si thin film and soft magnetic thin films where the soft magnetic thin films having the double-layer structure are further formed in a plurality of layers. Moreover, the soft magnetic films 52 and 58 may be soft magnetic multilayer films where soft magnetic films configured as described above and non-magnetic films are alternately laminated. It is desirable that the composition range of the Fe—N thin film constituting the soft magnetic thin films be such that N is 1 to 25 atom % and Fe is 75 to 99 atom %.

Figure 20:
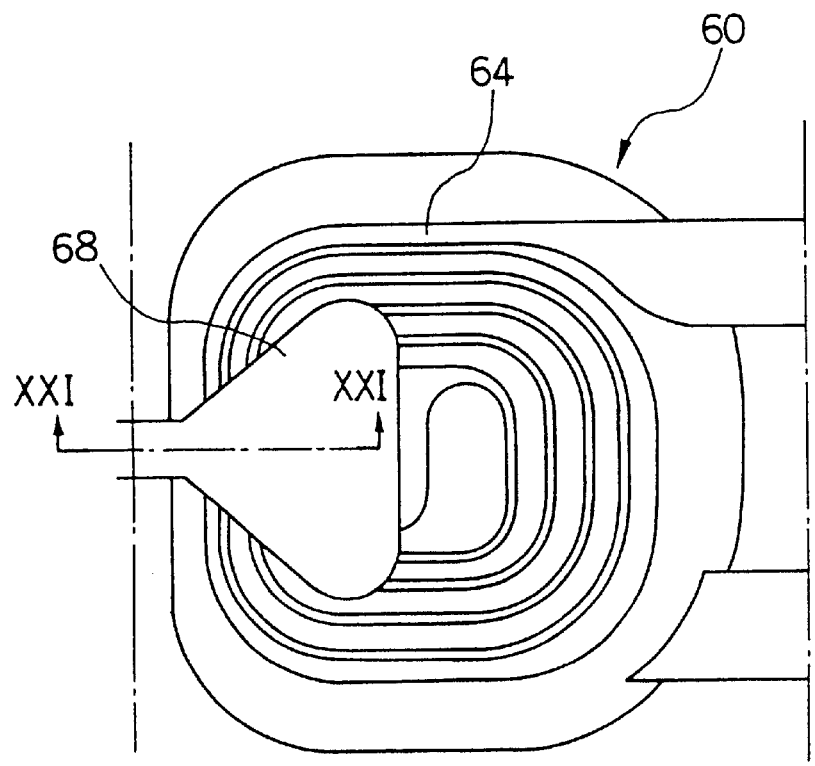
FIG. 20 is a plan view showing an example of a thin-film magnetic head which is a magnetic device according to the present invention.
Figure 21:
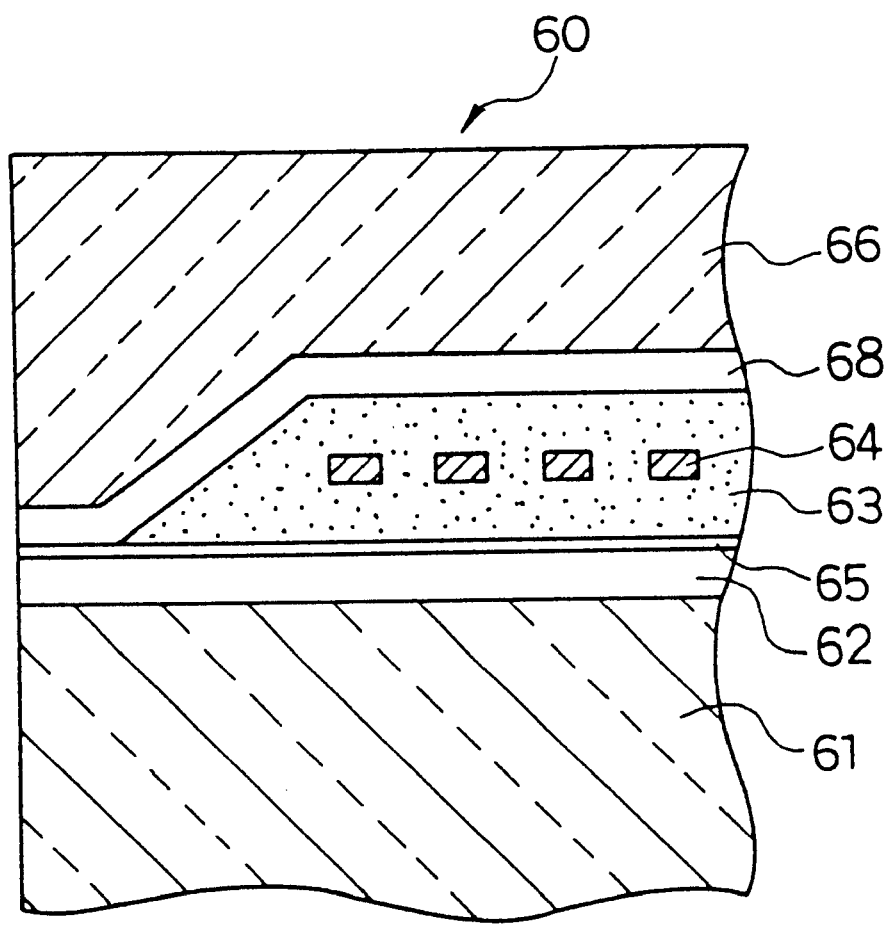
FIG. 21 is a partial cross-sectional view of the thin-film magnetic head shown in FIG. 20.

FIGS. 20 and 21 show a thin-film magnetic head which is an example of the magnetic device according to the present invention. FIG. 20 is a plan view of the thin-film magnetic head. FIG. 21 is a cross-sectional view, taken on the line XXI—XXI, of the thin-film magnetic head 60 shown in FIG. 20. In the thin-film magnetic head 60, the following are formed on the surface of an insulating substrate 61 such as Al$_2$O$_3$—TiC, in sequence from below in the figure, a lower soft magnetic film 62, a gap layer 65 made of Al$_2$O$_3$, SiO$_2$ or the like, an insulator layer 63 preferably SiO$_2$, a thin-film coil 64 made of copper or the like, an upper soft magnetic film 68, and a protective layer 66 made of Al$_2$O$_3$ or the like.

Figure 22:
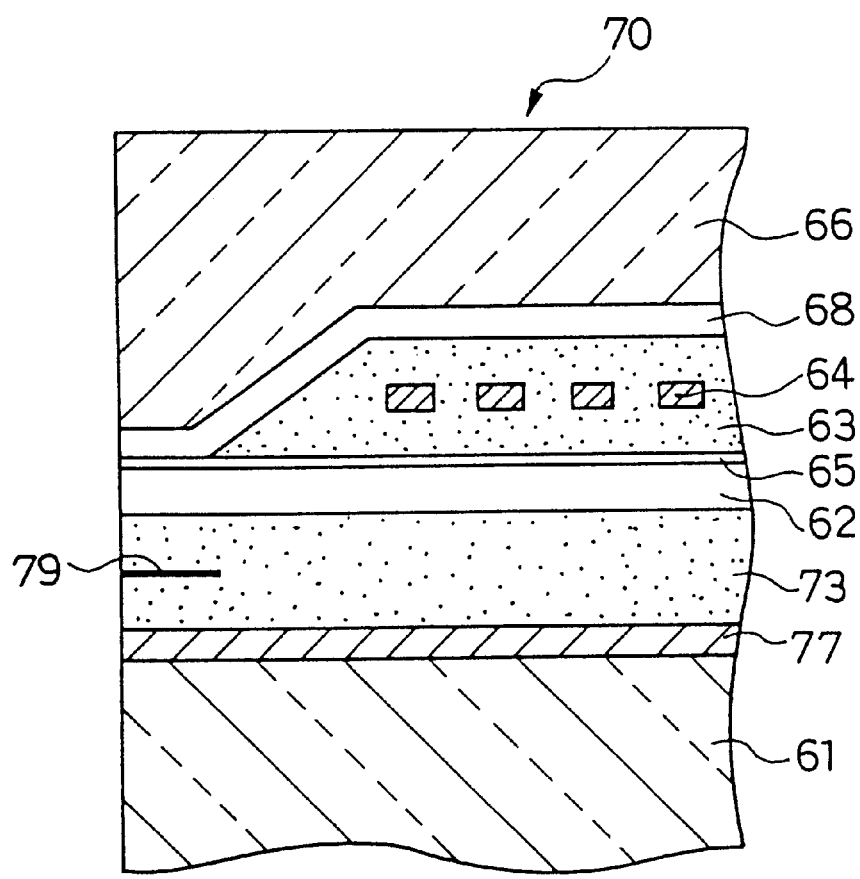
FIG. 22 is a partial cross-sectional view showing another example of the thin-film magnetic head which is a magnetic device according to the present invention.

FIG. 22 shows another example of the thin-film magnetic head. The thin-film magnetic head 70 is different from the thin-film magnetic head 60 shown in FIG. 20 in that an insulator layer 73 is sandwiched between the lower soft magnetic film 62 and a magnetic shielding core layer 77 and a magnetoresistive element 79 is inserted in a part of the insulator layer 73. In the thin-film magnetic head 70, a shielding-type magnetoresistive head (hereinafter, referred to as "MR head") is mounted as a reproduction-only head. The magnetoresistive element 79 is magnetically shielded by the lower soft magnetic film 62 and the magnetic shielding core 77. The magnetoresistive element 79 is made of a Permalloy (Trademark) thin film, or a magnetoresistive material such as CoO/NiFe/Cu/NiFe or CoMnB/Co/Cu/Co. While a shielding-type MR head has been described, the present invention is applicable to a yoke-type MR head.

As described above, the thin-film magnetic heads 60 and 70 which are examples of the magnetic device according to the present invention have the thin-film coil 64 wound in the direction of the laminated surface and the soft magnetic films 62 and 68 disposed so as to sandwich the thin-film coil 64 with the insulator layer 63 in between. In the soft magnetic films 62 and 68, it is desirable that the main phases be $\alpha$-Fe and $\gamma'$-Fe$_4$N, that the mean grain diameters of the $\alpha$-Fe phase and the $\gamma'$-Fe$_4$N phase be not more than 10 nm, that the spacings of the (110) lattice plane of $\alpha$-Fe parallel to the film surface and the (200) lattice plane of $\gamma'$-Fe$_4$N be expanded compared to those in the condition where there is no lattice strain, and that the spacing of the (111) lattice plane of $\gamma'$-Fe$_4$N be contracted compared to that in the condition where there is no lattice strain.

The soft magnetic films 62 and 68 constitute the magnetic core of the thin-film magnetic heads 60 and 70, and like in the above-described embodiments, may be any of single-layer soft magnetic thin films, soft magnetic thin films having the double-layer structure where the Fe—N thin film is formed on the Si thin film and soft magnetic thin films where the soft magnetic thin films having the double-layer structure are further formed in a plurality of layers. Moreover, the soft magnetic films 62 and 68 may be soft magnetic multilayer films where soft magnetic films configured as described above and non-magnetic films are alternately laminated. It is desirable that the composition range of the Fe—N thin film constituting the soft magnetic films 62 and 68 be such that N is 1 to 25 atom % and Fe is 75 to 99 atom %.

While the thin-film magnetic head has been described in this embodiment, the present invention is not limited thereto. The magnetic head may be a laminated type, a metal-in-gap (MIG) type and a main-pole-excitation type, or may be magnetic heads of other types.

Figure 23:
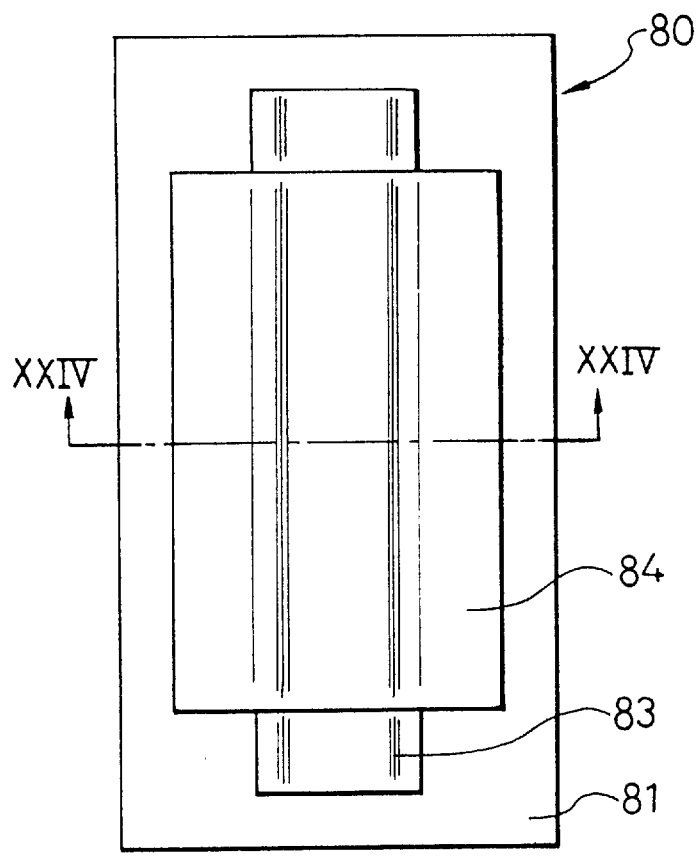
FIG. 23 is a plan view showing an example of a magnetic impedance device which is a magnetic device according to the present invention.
Figure 24:
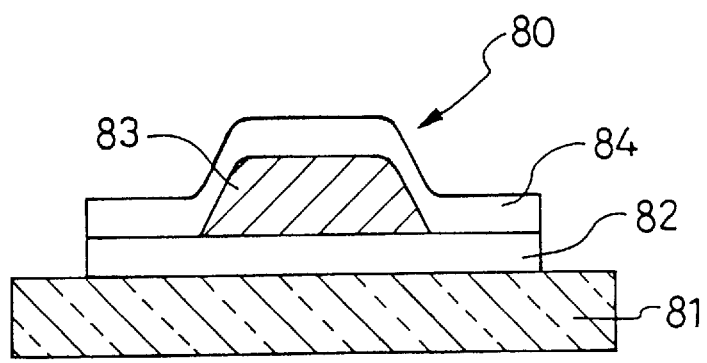
FIG. 24 is a cross-sectional view of the magnetic impedance device shown in FIG. 23.

FIGS. 23 and 24 show an example of a magnetic impedance device. FIG. 23 is a plan view of the magnetic impedance device. FIG. 24 is a cross-sectional view, taken on the line XXIV—XXIV, of the magnetic impedance device shown in FIG. 23.

As shown in FIGS. 23 and 24, in the magnetic impedance device 80, a bar non-magnetic conductor 83 made of Cu or the like is covered with a lower soft magnetic film 82 formed on the surface of a non-magnetic substrate 81, and an upper soft magnetic film 84 being in contact with the top surface and the side surfaces of the non-magnetic conductor 83.

In the lower soft magnetic film 82 and the upper soft magnetic film 84, it is desirable that the main phases be $\alpha$-Fe and $\gamma'$-Fe$_4$N, that the mean grain diameters of the $\alpha$-Fe phase and the $\gamma'$-Fe$_4$N phase be not more than 10 nm, that the spacings of the (110) lattice plane of $\alpha$-Fe parallel to the film surface and the (200) lattice plane of $\gamma'$-Fe$_4$N be expanded compared to those in the condition where there is no lattice strain, and that the spacing of the (111) lattice plane of $\gamma'$-Fe$_4$N be contracted compared to that in the condition where there is no lattice strain.

The lower soft magnetic film 82 and the upper soft magnetic film 84 shown in FIGS. 23 and 24 constitute the magnetic core of the magnetic impedance device, and like in the above-described embodiments, may be any of single-layer soft magnetic thin films, soft magnetic thin films having the double-layer structure where the Fe—N thin film is formed on the Si thin film and soft magnetic thin films where the soft magnetic films having the double-layer structure are further formed in a plurality of layers. Moreover, the soft magnetic films 62 and 68 may be soft magnetic multilayer films where soft magnetic films configured as described above and non-magnetic films are alternately laminated. It is desirable that the composition range of the Fe—N thin film constituting the soft magnetic thin films be such that N is 1 to 25 atom % and Fe is 75 to 99 atom %.

The above-mentioned magnetic devices including the soft magnetic films or the soft magnetic multilayer films in the magnetic core are used for antennas for liquid crystal televisions, electromagnetic interference suppressers, noise filters, pulse motors, choke coils, transformers, inductors, magnetic impedance devices, magnetic heads and the like. These can suitably be used for apparatuses because the magnetic devices have achieved size reduction, thickness reduction and higher performance.

As is apparent from the detailed description of the embodiments, the present invention has the following technical advantages: According to the present invention, the single-layer soft magnetic film, the soft magnetic film having the double-layer structure where the Fe—N thin film is formed on the Si thin film, the soft magnetic film where the soft magnetic films having the double-layer structure are formed in a plurality of layers, and the soft magnetic multilayer film where the above-mentioned soft-magnetic films and non-magnetic films are alternately laminated have a high saturation magnetic flux density and an excellent soft magnetic property. In the above-mentioned soft magnetic films and soft magnetic multilayer films, the main phases are $\alpha$-Fe and $\gamma'$-Fe$_4$N, the mean grain diameters of the $\alpha$-Fe phase and the $\gamma'$-Fe$_4$N phase are not more than 10 nm, the spacings of the (110) lattice plane of $\alpha$-Fe parallel to the film surface and the (200) lattice plane of $\gamma'$-Fe$_4$N are expanded compared to those in the condition where there is no lattice strain, and the spacing of the (111) lattice plane of $\gamma'$-Fe$_4$N is contracted compared to that in the condition where there is no lattice strain. Consequently, the magnetic devices using the high-performance soft magnetic films or soft magnetic multilayer films have an excellent magnetic property.

Moreover, according to the soft magnetic film and soft magnetic multilayer film manufacturing method of the present invention, films having an excellent soft magnetic property can easily and reliably be formed.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A soft magnetic film containing Fe and N, wherein main phases in the film are $\alpha$-Fe and $\gamma'$-Fe$_4$N, mean grain diameters of the $\alpha$-Fe phase and the $\gamma'$-Fe$_4$N phase are not more than about 10 nm, spacings of a lattice plane (110) of the $\alpha$-Fe phase parallel to a film surface and a lattice plane (200) of the $\gamma'$-Fe$_4$N phase are expanded compared to a respective lattice plane spacing in a condition where there is no lattice strain, and a spacing of a lattice plane (111) of the $\gamma'$-Fe$_4$N phase is contracted compared to a lattice plane spacing in a condition where there is no lattice strain.

2. A soft magnetic film having a double-layer structure in which a soft magnetic thin film is formed on a Si thin film, wherein said soft magnetic thin film contains Fe and N and in said soft magnetic thin film, main phases are $\alpha$-Fe and $\gamma'$-Fe$_4$N, mean grain diameters of the $\alpha$-Fe phase and the $\gamma'$-Fe$_4$N phase are not more than about 10 nm, spacings of a lattice plane (110) of the $\alpha$-Fe phase parallel to a film surface and a lattice plane (200) of the $\gamma'$-Fe$_4$N phase are expanded compared to a respective lattice plane spacing in a condition where there is no lattice strain, and a spacing of a lattice plane (111) of the $\gamma'$-Fe$_4$N phase is contracted compared to a lattice plane spacing in a condition where there is no lattice strain.

3. A soft magnetic film in accordance with claim 2, wherein said soft magnetic thin film is formed on the Si thin film in a plurality of layers.

4. A soft magnetic film in accordance with claim 1, wherein relative ratios of X-ray diffraction intensities of the (200) lattice plane and the (111) lattice plane of the $\gamma'$-Fe$_4$N phase to an X-ray diffraction intensity of the (110) lattice plane of the $\alpha$-Fe phase parallel to the film surface are both not more than about 1.

5. A soft magnetic film, wherein a composition range of said soft magnetic film in accordance with claim 1 is such that N is 1 to 25 atom % and Fe is 75 to 99 atom %.

6. A soft magnetic film in accordance with claim 1, wherein a substrate supporting said soft magnetic film is made of Si.

7. A soft magnetic multilayer film comprising a soft magnetic film and a non-magnetic film being alternately laminated, wherein said soft magnetic film contains Fe and N, and in said soft magnetic film, main phases are $\alpha$-Fe and $\gamma'$-Fe$_4$N, mean grain diameters of the $\alpha$-Fe phase and the $\gamma'$-Fe$_4$N phase are not more than about 10 nm, spacings of a lattice plane (110) of the $\alpha$-Fe phase parallel to a film surface and a lattice plane (200) of the $\gamma'$-Fe$_4$N phase are expanded compared to a respective lattice plane spacing in a condition where there is no lattice strain, spacing of a lattice plane (111) of the $\gamma'$-Fe$_4$N phase is contracted compared to a lattice plane spacing in a condition where there is no lattice strain.

8. A soft magnetic multilayer film comprising a soft magnetic film and a non-magnetic film being alternately laminated, wherein said soft magnetic film has a double-layer structure where a soft magnetic thin film is formed on a Si thin film, said soft magnetic thin film contains Fe and N and in said soft magnetic thin film, main phases are α-Fe and γ'-Fe$_4$N, mean grain diameters of the α-Fe phase and the γ'-Fe$_4$N phase are not more than about 10 nm, spacings of a lattice plane (110) of the α-Fe phase parallel to a film surface and a lattice plane (200) of the γ'-Fe$_4$N phase are expanded compared to the respective lattice plane spacings in a condition where there is no lattice strain, and a spacing of a lattice plane (111) of the γ'-Fe$_4$N phase is contracted compared to a lattice plane spacing in a condition where there is no lattice strain.

9. A method of manufacturing the soft magnetic film in accordance with claim 1, said method comprising the step of forming said soft magnetic film on a cooled substrate.

10. A method of manufacturing the soft magnetic film in accordance with claim 1, said method comprising the step of annealing said soft magnetic film at a temperature of not more than 300° C.

11. A method of manufacturing the soft magnetic film in accordance with claim 1, said method comprising the step of forming said soft magnetic film on a cooled substrate and the step of annealing said soft magnetic film at a temperature of not more than 300° C.

12. A method of manufacturing the soft magnetic multilayer film in accordance with claim 7, said method comprising the step of forming said soft magnetic multilayer film on a cooled substrate.

13. A method of manufacturing the soft magnetic multilayer film in accordance with claim 7, said method comprising the step of annealing said soft magnetic multilayer film at a temperature of not more than 300° C.

14. A method of manufacturing the soft magnetic multilayer film in accordance with claim 7, said method comprising the step of forming said soft magnetic multilayer film on a cooled substrate and the step of annealing said soft magnetic multilayer film at a temperature of not more than 300° C.

15. A magnetic device including a soft magnetic film in a magnetic core, wherein said soft magnetic film contains Fe and N, and in said soft magnetic film, main phases are α-Fe and γ'-Fe$_4$N, mean grain diameters of the α-Fe phase and the γ'-Fe$_4$N phase are not more than 10 nm, spacings of a lattice plane (110) of the α-Fe phase parallel to a film surface and a lattice plane (200) of the γ'-Fe$_4$N phase are expanded compared to a respective lattice plane spacing in a condition where there is no lattice strain, and a spacing of a lattice plane (111) of the γ'-Fe$_4$N phase is contracted compared to a lattice plane spacing in a condition where there is no lattice strain.

16. A magnetic device including a soft magnetic film in a magnetic core, wherein said soft magnetic film has a double-layer structure where a soft magnetic thin film is formed on a Si thin film, said soft magnetic thin film contains Fe and N, and in said soft magnetic thin film, main phases are α-Fe and γ'-Fe$_4$N, mean grain diameters of the α-Fe phase and the γ'-Fe$_4$N phase are not more than 10 nm, spacings of a lattice plane (110) of the α-Fe phase parallel to a film surface and a lattice plane (200) of the γ'-Fe$_4$N phase are expanded compared to a respective lattice plane spacing in a condition where there is no lattice strain, and a spacing of a lattice plane (111) of the γ'-Fe$_4$N phase is contracted compared to a lattice plane spacing in a condition where there is no lattice strain.

17. A magnetic device including a soft magnetic multilayer film in a magnetic core, wherein said soft magnetic multilayer film comprises a soft magnetic film and a nonmagnetic film being alternately laminated, said soft magnetic film contains Fe and N, and in said soft magnetic film, main phases are α-Fe and γ'-Fe$_4$N, mean grain diameters of the α-Fe phase and the γ'-Fe$_4$N phase are not more than 10 nm, spacings of a lattice plane (110) of the α-Fe phase parallel to a film surface and a lattice plane (200) of the γ'-Fe$_4$N phase are expanded compared to a respective lattice spacing in a condition where there is no lattice strain, and a spacing of a lattice plane (111) of the γ'-Fe$_4$N phase is contracted compared to a lattice spacing in a condition where there is no lattice strain.

18. A magnetic device including a soft magnetic multilayer film in a magnetic core, wherein said soft magnetic multilayer film comprises a soft magnetic film and a nonmagnetic film being alternately laminated, said soft magnetic film has a double-layer structure where a soft magnetic thin film is formed on a Si substrate, said soft magnetic thin film contains Fe and N, and in said soft magnetic thin film, main phases are α-Fe and γ'-Fe$_4$N, mean grain diameters of the α-Fe phase and the γ'-Fe$_4$N phase are not more than 10 nm, spacings of a lattice plane (110) of the α-Fe phase parallel to a film surface and a lattice plane (200) of the γ'-Fe$_4$N phase are expanded compared to a respective lattice spacing in a condition where there is no lattice strain, and a spacing of a lattice plane (111) of the γ'-Fe$_4$N phase is contracted compared to a lattice plane (111) spacing in a condition where there is no lattice strain.

19. A magnetic device in accordance with claim 15, constituting an antenna for a liquid crystal television, an electromagnetic interference suppressor, a noise filter, a pulse motor, a choke coil, a transformer, an inductor, a magnetic impedance device or a magnetic head.

20. A soft magnetic film in accordance with claim 2, wherein relative ratios of X-ray diffraction intensities of the (200) lattice plane and the (111) lattice plane of the γ'-Fe$_4$N phase to an X-ray diffraction intensity of the (110) lattice plane of the α-Fe phase parallel to the film surface are both not more than 1.

21. A soft magnetic film in accordance with claim 3, wherein relative ratios of X-ray diffraction intensities of the (200) lattice plane and the (111) lattice plane of the γ'-Fe$_4$N phase to an X-ray diffraction intensity of the (110) lattice plane of the α-Fe phase parallel to the film surface are both not more than 1.

22. A soft magnetic film, wherein a composition range of said magnetic film in accordance with claim 2 is such that N is 1 to 25 atom % and Fe is 75 to 99 atom %.

23. A soft magnetic film, wherein a composition range of said magnetic film in accordance with claim 3 is such that N is 1 to 25 atom % and Fe is 75 to 99 atom %.

24. A soft magnetic film in accordance with claim 2 wherein a substrate supporting said soft magnetic film is made of Si.

25. A soft magnetic film in accordance with claim 3, wherein a substrate supporting said soft magnetic film is made of Si.

26. A method of manufacturing the soft magnetic film in accordance with claim 2, said method comprising the step of forming said soft magnetic film on a cooled substrate.

27. A method of manufacturing the soft magnetic film in accordance with claim 3, said method comprising the step of forming said soft magnetic film on a cooled substrate.

28. A method of manufacturing the soft magnetic film in accordance with claim 2, said method comprising the step of annealing said soft magnetic film at a temperature of not more than 300° C.

29. A method of manufacturing the soft magnetic film in accordance with claim 3, said method comprising the step of annealing said soft magnetic film at a temperature of not more than 300° C.

30. A method of manufacturing the soft magnetic film in accordance with claim 2, said method comprising the step of forming said soft magnetic film on a cooled substrate and the step of annealing said soft magnetic film at a temperature of not more than 300° C.

31. A method of manufacturing the soft magnetic film in accordance with claim 3, said method comprising the step of forming said soft magnetic film on a cooled substrate and the step of annealing said soft magnetic film at a temperature of not more than 300° C.

32. A method of manufacturing the soft magnetic multilayer film in accordance with claim 8, said method comprising the step of forming said soft magnetic multilayer film on a cooled substrate.

33. A method of manufacturing the soft magnetic multilayer film in accordance with claim 8, said method comprising the step of annealing said soft magnetic multilayer film at a temperature of not more than 300° C.

34. A method of manufacturing the soft magnetic multilayer film in accordance with claim 8, said method comprising the step of forming said soft magnetic multilayer film on a cooled substrate and the step of annealing said soft magnetic multilayer film at a temperature of not more than 300° C.

35. A magnetic device in accordance with claim 16, constituting an antenna for a liquid crystal television, an electromagnetic interference suppressor, a noise filter, a pulse motor, a choke coil, a transformer, an inductor, a magnetic impedance device or a magnetic head.

36. A magnetic device in accordance with claim 17, constituting an antenna for a liquid crystal television, an electromagnetic interference suppressor, a noise filter, a pulse motor, a choke coil, a transformer, an inductor, a magnetic impedance device or a magnetic head.

37. A magnetic device in accordance with claim 18, constituting an antenna for a liquid crystal television, an electromagnetic interference suppressor, a noise filter, a pulse motor, a choke coil, a transformer, an inductor, a magnetic impedance device or a magnetic head.

* * * * *